(12) United States Patent
Kim (10) Patent No.: US 9,209,370 B2
(45) Date of Patent: Dec. 8, 2015

(54) LIGHT EMITTING DEVICE AND LIGHT EMITTING DEVICE PACKAGE

(71) Applicant: LG INNOTEK CO., LTD., Seoul (KR)

(72) Inventor: Young Hoon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/311,700

(22) Filed: Jun. 23, 2014

(65) Prior Publication Data

US 2014/0374784 A1 Dec. 25, 2014

(30) Foreign Application Priority Data

Jun. 24, 2013 (KR) ........................ 10-2013-0072063

(51) Int. Cl.
*H01L 33/00* (2010.01)
*H01L 33/60* (2010.01)
*H01L 33/10* (2010.01)
*H01L 33/38* (2010.01)

(52) U.S. Cl.
CPC ............ *H01L 33/60* (2013.01); *H01L 33/0025* (2013.01); *H01L 33/10* (2013.01); *H01L 33/382* (2013.01); *H01L 33/387* (2013.01)

(58) Field of Classification Search
CPC ...................................................... H01L 27/288
USPC ............................................................ 257/94
See application file for complete search history.

(56) References Cited

U.S. PATENT DOCUMENTS

| 2012/0049236 A1 | 3/2012 | Kamiya et al. ................ 257/99 |
| 2012/0286307 A1 | 11/2012 | Fang et al. ................... 257/98 |
| 2014/0167080 A1* | 6/2014 | Huang et al. ................. 257/93 |

FOREIGN PATENT DOCUMENTS

WO  WO 2012/039555 A2  3/2012

OTHER PUBLICATIONS

European Search Report dated Oct. 30, 2014 issued in Application No. 14 173 394.9.

* cited by examiner

*Primary Examiner* — Elias M Ullah
(74) *Attorney, Agent, or Firm* — Ked & Associates LLP (57) ABSTRACT

A light emitting device includes a light emitting structure below a substrate, in which at least one first contact area and at least one second contact area are defined. A plurality of layers having mutually different refractive indexes is provided below the light emitting structure.

20 Claims, 6 Drawing Sheets

LIGHT EMITTING DEVICE AND LIGHT EMITTING DEVICE PACKAGE

CROSS-REFERENCE TO RELATED APPLICATION(S)

This application claims priority under 35 U.S.C. §119 to Korean Application No. 10-2013-0072063 filed on Jun. 24, 2013, whose entire disclosure(s) is/are hereby incorporated by reference.

BACKGROUND

1. Field

The embodiment relates to a light emitting device.

2. Background

The embodiment relates to a light emitting device package.

Studies for a light emitting device and a light emitting device package have been actively pursued.

A light emitting device, which is made of, for example, a semiconductor material, is a semiconductor light emitting device or a semiconductor light emitting diode to convert electrical energy into light energy.

When comparing with another light source such as a fluorescent lamp or an incandescent lamp, the light emitting device has advantages such as low power consumption, a semi-permanent life span, a rapid response speed, safety, and an eco-friendly property. In this regard, various studies have been performed to replace the conventional light sources with the semiconductor LEDs.

The light emitting devices have been increasingly used as light sources for various kinds of lamps used in indoors and outdoors, back-light units of liquid crystal displays, display devices such as electric signboards, and lighting devices such as street lamps.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
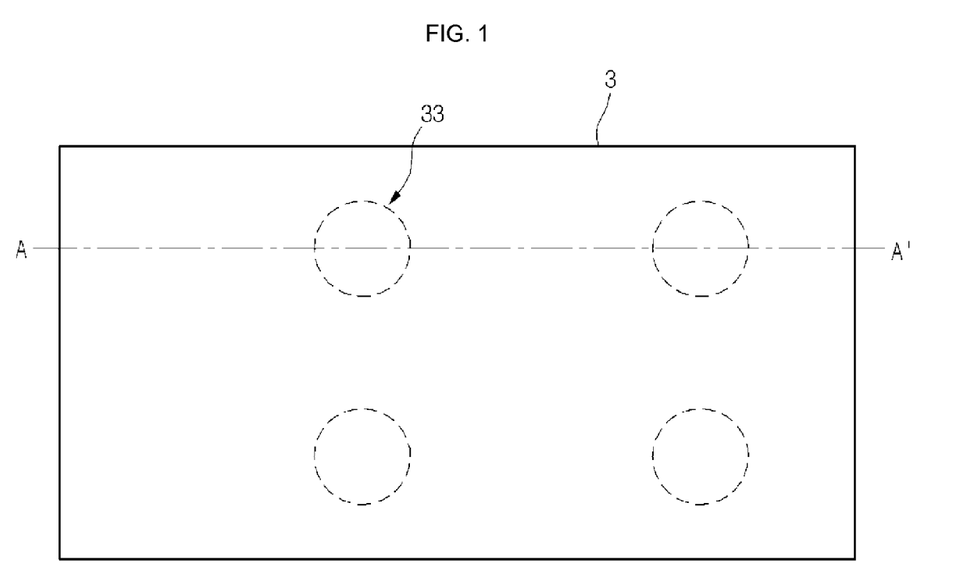
FIG. 1 is a plan view showing a light emitting device according to an embodiment.

FIG. 1 is a plan view showing a light emitting device according to an embodiment. Referring to FIG. 1, the light emitting device according to the embodiment may be a flip-chip type light emitting device which is bonded by using a bump. The light emitting device may include a plurality of recesses 33, but the embodiment is not limited thereto.

The light emitting device according to the embodiment may include a growth substrate 3 and a light emitting structure (not shown) grown below the growth substrate 3. In this case, the growth substrate 3 is placed on the light emitting structure and a bump is placed below the light emitting structure, such that the light emitting structure is electrically connected to a package body (not shown) of a light emitting device package. Thus, according to the light emitting device of the embodiment, since a wire is not used, a power supply error due to broken wires or an electric short circuit between the wire and the active layer of the light emitting structure may be prevented.

Figure 2:
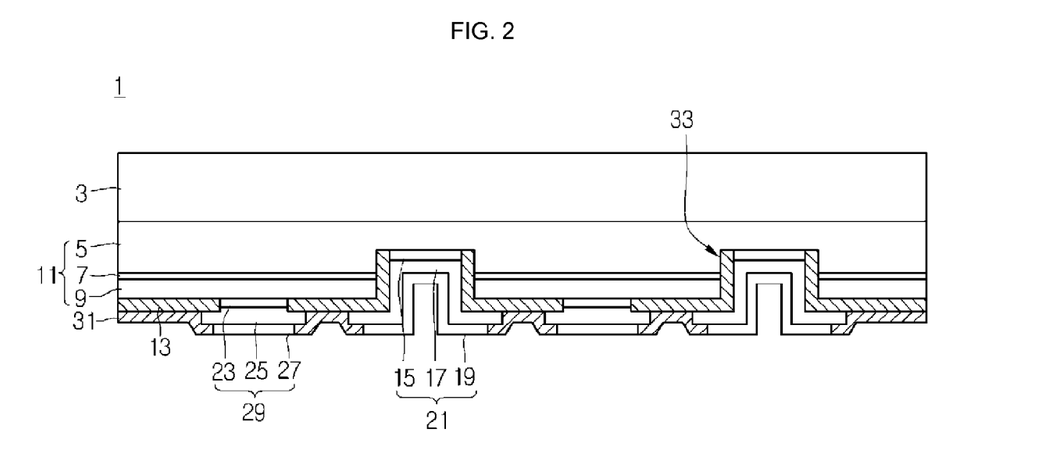
FIG. 2 is a sectional view showing a light emitting device according to the first embodiment.

The plan view of the light emitting device shown in FIG. 1 may be applied in common to the first to fourth embodiments described below. FIG. 2 is a sectional view showing a light emitting device according to the first embodiment. That is, FIG. 2 is a sectional view taken along line A-A' of FIG. 1.

Referring to FIGS. 1 and 2, the light emitting device 1 according to the first embodiment may include a growth substrate 3, a light emitting structure 11, a reflective structure 13, and first and second electrodes 21 and 29.

The light emitting device 1 may include at least one first electrode 21, but the embodiment is not limited thereto. The light emitting device 1 may include at least one second electrode 29, but the embodiment is not limited thereto. The light emitting device 1 according to the embodiment may further include an insulating layer 31. The insulating layer 31 may be disposed on the light emitting structure 11 exposed between the first and second electrodes 21 and 29, but the embodiment is not limited thereto.

The light emitting device 1 according to the first embodiment may further include first and second bumps (not shown) disposed below the first and second electrodes 21 and 29. The light emitting device 1 may include at least one first bump, but the embodiment is not limited thereto. The light emitting device 1 may include at least one second bump and each of the first and second bumps may have a cylindrical shape, but the embodiment is not limited thereto.

The light emitting device 1 according to the first embodiment may further include a buffer layer (not shown) disposed between the growth substrate 3 and the light emitting structure 11 and may further include at least one compound semiconductor layer (not shown) disposed on and/or below the light emitting structure 11, but the embodiment is not limited thereto.

The buffer layer and the light emitting device 11 may be formed of a group II-VI compound semiconductor material or a group III-V compound semiconductor material. For example, the buffer layer 4 and the light emitting structure 11 may include at least one selected from the group consisting of InAlGaN, GaN, AlGaN, InGaN, AlN, InN, and AlInN, but the embodiment is not limited thereto. The growth substrate 3 is used to grow the light emitting structure 11 while supporting the light emitting structure 11. The growth substrate 3 may include a material suitable to grow a semiconductor material.

The growth substrate 3 may include a material having thermal stability and a lattice constant approximate to that of the light emitting structure 11. The growth substrate 3 may be one of a conductive substrate, a compound semiconductor substrate and an insulating substrate, but the embodiment is not limited thereto.

The growth substrate 3 may include at least one selected from the group consisting of Sapphire ($Al_2O_3$), SiC, Si, GaAs, GaN, ZnO, GaP, InP and Ge.

The growth substrate 3 may include dopants such that the growth substrate 3 has conductivity. The growth substrate 3 including the dopants may serve as an electrode, but the embodiment is not limited thereto.

The buffer layer may be disposed below the growth substrate 3. The buffer layer may reduce the difference between the lattice constants of the growth substrate 3 and the light emitting structure 11. In addition, the buffer layer may prevent the material of the growth substrate 3 from being diffused into the light emitting structure 11, prevent a melt-back phenomenon such as a recess formed in the top surface of the growth substrate 3, or prevent the growth substrate 3 from being broken by controlling strain, but the embodiment is not limited thereto.

The light emitting structure 11 may be formed below the growth substrate 3 or the buffer layer. Since the light emitting structure 11 is grown on the buffer layer having a lattice constant similar to a lattice constant of the light emitting structure 11, the possibility of causing a defect such as a dislocation may be reduced.

The light emitting structure 11 may include a plurality of compound semiconductor layers. For example, the light emitting structure 11 may include first and second conductive semiconductor layers 5 and 9 and an active layer 7, but the embodiment is not limited thereto.

The first conductive semiconductor layer 5 may be disposed below the growth substrate 13 or the buffer layer, the active layer 7 may be disposed below the first conductive semiconductor layer 5, and the second conductive semiconductor layer 9 may be disposed below the active layer 7.

The first and second conductive semiconductor layers 5 and 9 and the active layer 7 may be realized by using a group II-VI or III-V compound semiconductor material having a composition formula of $Al_xIn_yGa_{(1-x-y)}N$ ($0 \le x \le 1$, $0 \le y \le 1$, and $0 \le x+y \le 1$). For example, the first and second conductive semiconductor layers 5 and 9 and the active layer 7 may include at least one selected from the group consisting of InAlGaN, GaN, AlGaN, InGaN, AlN, InN and AlInN, but the embodiment is not limited thereto.

For example, the first conductive semiconductor layer 5 may be an N-type semiconductor layer including N-type dopants, and the second conductive semiconductor layer 9 may be a P-type semiconductor layer including P-type dopants, but the embodiment is not limited thereto. The N-type dopants include Si, Ge, and Sn, and the P-type dopants include Mg, Zn, Ca, Sr, and Ba, but the embodiment is not limited thereto.

The active layer 7 emits light having a wavelength corresponding to an energy band gap between the materials constituting the active layer 7 by combining the first carrier, for example, electrons injected through the first conductive semiconductor layer 5 with the second carrier, for example, holes injected through the second conductive semiconductor layer 9.

The active layer 7 may include one of an MQW (multiple quantum well) structure, a quantum wire structure or a quantum dot structure. The active layer 7 may have well layers and barrier layers repeatedly formed at one cycle of a well layer and a barrier layer. The repetition cycle of a well layer and a barrier layer may be varied depending on the characteristics of the light emitting device, but the embodiment is not limited thereto.

For example, the active layer 7 may be formed in the stack structure of InGaN/GaN, InGaN/AlGaN, InGaN/InGaN. The energy bandgap of the barrier layer may be greater than energy the bandgap of the well layer.

Although not shown, a third conductive semiconductor layer may be disposed on the first conductive semiconductor layer 5 and/or below the second conductive semiconductor layer 9. For example, the third conductive semiconductor layer disposed on the first conductive semiconductor layer 5 may include the same conductive dopant as that of the second conductive semiconductor layer 9, but the embodiment is not limited thereto. For example, the third conductive semiconductor layer disposed below the second conductive semiconductor layer 9 may include the same conductive dopant as that of the first conductive semiconductor layer 5, but the embodiment is not limited thereto.

As shown in FIG. 1, the light emitting layer 1 according to the first embodiment may include a plurality of recesses 33. The recesses 33 may be formed from a lower surface of the light emitting device 1 to an inside of the light emitting device. That is, the recesses 33 may pass through the second conductive semiconductor layer 9 and the active layer 7, so that the recesses 33 may extend from a lower surface of the second conductive semiconductor layer 9 to the first conductive semiconductor layer 5. A portion of the first conductive semiconductor layer 5 may be removed after second conductive semiconductor layer 9 and the active layer 7 are removed through an etching process.

Each of the recesses 33 may have a cylindrical shape, so that a surface area of the light emitting device exposed to an outside may be maximized when compared with an etching amount, but the embodiment is not limited thereto. The recesses 33 may be formed to electrically connect the first conductive semiconductor layer 5 to the first electrode 21, but the embodiment is not limited thereto.

Figure 4:
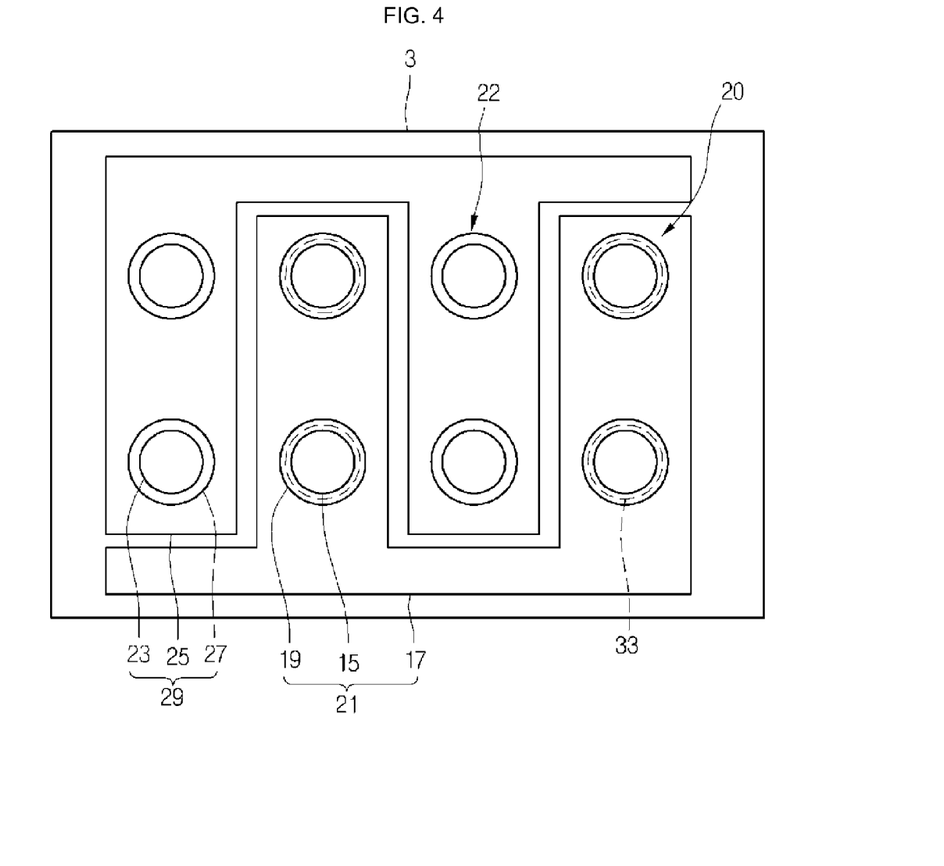
FIG. 4 is a plan view showing the first and second electrodes of FIG. 2.

As shown in FIG. 4, a first contact area 20 may be defined by the recess 33. The first contact area 20 may signify an area in which the first electrode 21 makes contact with the first conductive semiconductor layer 5, but the embodiment is not limited thereto. Since at least one recess 33 may be formed, at least one first contact area 20 may be defined.

A second contact area 22 may be defined on the lower surface of the second conductive semiconductor layer 9. The second contact area 22 may signify an area in which the second electrode 29 makes contact with the second conductive semiconductor layer 9, but the embodiment is not limited thereto. At least one second contact area 22 may be defined.

The first contact area 20 may be adjacent to the second contact area 22. For example, the first contact area 20 may be formed between the adjacent second contact areas 22 to each other, but the embodiment is not limited thereto. For example, the first contact area 20 may be surrounded by the second contact areas 22, but the embodiment is not limited thereto.

The second contact area 22 may be adjacent to the first contact area 20. For example, the second contact area 22 may be formed between the first contact areas 20 and may be surrounded by the first contact area 20, but the embodiment is not limited thereto.

The first electrode 21 may be formed in the first contact area 20. The second electrode 29 may be formed in the second contact area 22. The first electrode 21 may make contact with the lower surface of the first conductive semiconductor layer 5 in the recess 33 in the first contact area 20. The first electrode 21 may be electrically connected to the first conductive semiconductor layer 5.

The second electrode 29 may make contact with the lower surface of the second conductive semiconductor layer 9 in the second contact 22. The second electrode 29 may be electrically connected to the second conductive semiconductor layer 9.

The reflective structure 13 may be formed below the light emitting structure 11 except for the first and second electrodes 21 and 29. The reflective structure 13 may be formed on the lower surface of the second conductive semiconductor layer 9. In addition, the reflective structure 13 may be further formed on an inside surface of the light emitting structure 11 in the recess 33, but the embodiment is not limited thereto. In this case, the inside surface of the light emitting structure 11 signifies a side surface of the light emitting structure 11 exposed and formed by the recess 33. The reflective structure 13 may be further formed on an inside surface of the second conductive semiconductor layer 9 in the recess 33, an inside surface of the active layer 7 and an inside surface of the first conductive semiconductor layer 5.

The reflective structure 13 may upwardly reflect the light generated from the active layer 7 and travelling in a low or side direction, so that the light efficiency may be improved. The reflective structure 13 may be formed on the lower surface of the second conductive semiconductor layer 9 between the first and second electrodes 21 and 29. Since the reflective structure 13 has an insulation property, the reflective structure 13 may prevent the first and second electrodes 21 and 29 from being short-circuited to each other.

Since the reflective structure 13 of the light emitting device 1 according to the first embodiment has the insulating function which prevents the first and second electrodes 21 and 29 from being short-circuited to each other as well as the light reflection function, an insulating layer 31 may be additionally required, so that the structure may be simplified and the cost may be reduced. The reflective structure 13 may include a distributed Bragg reflector (DBR) structure, but the embodiment is not limited thereto.

Figure 3:
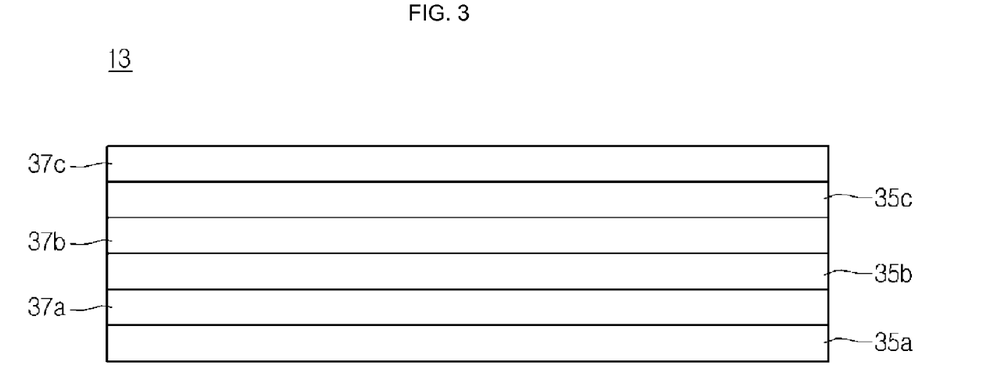
FIG. 3 is a sectional view showing the reflective structure of FIG. 2 in detail.

As shown in FIG. 3, the reflective structure 13 may include first refractive index layers 35a, 35b and 35c and second refractive index layers 37a, 37b and 37c which are alternatively stacked. The structure, in which three first refractive index layers 35a, 35b and 35c and three second refractive index layers 37a, 37b and 37c are stacked, is depicted in FIG. 3 for the purpose of convenience of description, but the embodiment is not limited thereto.

If the first refractive index layer 35a, 35b or 35c and the second refractive index layer 37a, 37b or 37c are defined as one pair, the reflective structure 13 may include the number of pairs in the range of 3 to 30, but the embodiment is not limited thereto. In detail, the reflective structure 13 may the number of pairs in the range of 5 to 15.

The first refractive index layer 35a, 35b or 35c and the second refractive index layer 37a, 37b or 37c may include mutually different materials, but the embodiment is not limited thereto.

The first refractive index layer 35a, 35b or 35c and the second refractive index layer 37a, 37b or 37c may include a transparent material and/or an insulating material. For example, the first refractive index layer 35a, 35b or 35c and the second refractive index layer 37a, 37b or 37c may include at least one selected from the group consisting of TiN, AlN, $TiO_2$, $Al_2O_3$, $SnO_2$, $WO_3$, $ZrO_2$ and $SiO_2$, respectively, but the embodiment is not limited thereto.

For example, the first refractive index layer 35a, 35b or 35c may include $SiO_2$ and the second refractive index layer 37a, 37b or 37c may include $TiO_2$, but the embodiment is not limited thereto.

The reflective property of the reflective structure 13 may be determined according to the sort of materials for the first refractive index layer 35a, 35b or 35c and the second refractive index layer 37a, 37b or 37c, the thickness of each of the first refractive index layer 35a, 35b or 35c and the second refractive index layer 37a, 37b or 37c, and the number of pairs of the first refractive index layer 35a, 35b or 35c and the second refractive index layer 37a, 37b or 37c.

For example, when the number of pairs of the first refractive index layer 35a, 35b or 35c of $SiO_2$ and the second refractive index layer 37a, 37b or 37c of $TiO_2$ is in the range of 3 to 30, the reflective structure 13 according to the first embodiment may have the reflective property of about 98% or more, but the embodiment is not limited thereto.

When the number of pairs of the first refractive index layer 35a, 35b or 35c and the second refractive index layer 37a, 37b or 37c is two or less, the reflective property of the reflective structure 13 may be decreased at 95% or less, so that the light extraction efficiency may be sharply reduced, thereby causing the first and second electrodes 21 and 29 to be short-circuited to each other.

When the number of pairs of the first refractive index layer 35a, 35b or 35c and the second refractive index layer 37a, 37b or 37c is 31 or more, a volume of the reflective structure 13 is increased so that it is difficult to form the first and second electrodes 21 and 29. As shown in FIG. 4, the first and second electrodes 21 and 29 may be formed on the first and second contact areas 20 and 22, respectively.

Referring to FIGS. 2 and 4, the first electrode 21 may include a first electrode layer 15 disposed on the lower surface of the first conductive semiconductor layer 5, a second electrode layer 17 disposed on a lower surface of the first electrode layer 15 and a third electrode layer 19 disposed on a lower surface of the second electrode layer 17.

The second electrode 29 may include a first electrode layer 23 disposed on the lower surface of the second conductive semiconductor layer 9, a second electrode layer 25 disposed on a lower surface of the first electrode layer 23 and a third electrode layer 27 disposed on a lower surface of the second electrode layer 25.

As shown in FIG. 4, the first electrode layers 15 and 23 and the third electrode layers 19 and 27 have a circular shape when viewed in a top view, but the embodiment is not limited thereto.

The first electrode layer 15 of the first electrode 21 may make contact with the lower surface of the first conductive semiconductor layer 5 exposed through the recess 33 in the first contact area 20. The reflective structure may be formed between an inside surface of the first conductive semiconductor layer 5 and the first electrode layer 15 of the first electrode 21 in the recess 33. Although not shown, the first electrode layer 15 of the first electrode 21 may make direct contact with the inside surface of the first conductive semiconductor layer 5, but the embodiment is not limited thereto.

The first electrode layer 23 of the second electrode 29 may make contact with a portion of the lower surface of the second conductive semiconductor layer 9 in the second contact area 22.

The reflective structure 13 may be formed between the first electrode layer 15 of the first electrode 21 and the first electrode layer 23 of the second electrode 29. That is, the reflective structure 13 may extend from the lower surface of the second conductive semiconductor layer 9 adjacent to the first electrode layer 15 of the first electrode 21 and may be adjacent to the first electrode layer 23 of the second electrode 29 via the inside surface of the second conductive semiconductor layer 9 and the inside surface of the active layer 7. The first electrode layer 15 of the first electrode 21 may be insulated from the first electrode layer 23 of the second electrode 29 by the reflective structure 13.

The first electrode layer 15 of the first electrode 21 and the first electrode layer 23 of the second electrode 29 may include a material having a superior reflective property and superior electric conductivity. For example, the first electrode layer 15 of the first electrode 21 and the first electrode layer 23 of the second electrode 29 may include one selected from the group consisting of Ag, Ni, Al, Rh, Pd, Ir, Ru, Mg, Zn, Pt, Au, Hf, Ti and TiW or the multilayered structure thereof, but the embodiment is not limited thereto. For example, the first electrode layer 15 of the first electrode 21 and the first electrode layer 23 of the second electrode 29 may include a multilayered structure such as Ag/Ni/Ti/TiW/Ti. The Ag has a reflective function, the Ni has a reflective function, a junction function or a diffusion prevention function, the Ti has a junction function, and the TiW has the diffusion prevention function, but the embodiment is not limited thereto.

The second electrode layer 17 of the first electrode 21 may be formed on the lower surface of the first electrode layer 15. The second electrode layer 17 of the first electrode 21 may electrically connect the adjacent first contact areas 20 to each other. That is, the second electrode layer 17 of the first electrode 21 may be formed in the first contact area 20 placed at one side and may extend from the first contact area 20 to the first contact area 20 placed at an opposite side.

The second electrode layer 17 of the first electrode 21 may be formed on the reflective structure 13 as well as the lower surface of the first electrode layer 15. That is, the second electrode layer 17 of the first electrode 21 may make contact with the lower surface of the first electrode layer 15 in the recess 33, may extend from the first electrode layer 15 to make contact with a side surface of the reflective structure 13 formed in the recess 33, and may make contact with a portion of the lower surface of the reflective structure 13 formed on the lower surface of the second conductive semiconductor layer, but the embodiment is not limited thereto.

The second electrode layer 25 of the second electrode 29 may be formed on the lower surface of the first electrode layer 23. The second electrode layer 25 of the first electrode 21 may electrically connect the adjacent second contact areas 22 to each other. That is, the second electrode layer 25 of the first electrode 21 may be formed in the second contact area 22 placed at one side and may extend from the second contact area 22 to the second contact area 22 placed at an opposite side.

The second electrode layer 25 of the second electrode 29 may be formed on a portion of the lower surface of the reflective structure 13 as well as the lower surface of the first electrode layer 23. A width of the second electrode layers 17 and 25 may be greater than a diameter of the first electrode layer 15 or 23, but the embodiment is not limited thereto.

The second electrode layer 17 of the first electrode 21 may cover the first electrode layer 15 and the second electrode layer may cover the first electrode layer 23, but the embodiment is not limited thereto. Since the first electrode layer 15 or 23 covers the second electrode layer 17 or 25, the adhesive strength of the first electrode layer 15 or 23 to the first or second conductive semiconductor layer 5 or 9 is weakened, so that the first electrode layer 15 or 23 may be prevented from being peeled off from the first or second conductive semiconductor layer 5 or 9.

In addition, the first and/or second contact areas 20 or 22 are electrically connected to each other by the second electrode layer 17 or 25, so that electric power may be supplied in a lump to each contact area.

The second electrode layers 17 and 25 of the first and second electrodes 21 and 29 may include a material having superior electric conductivity. The second electrode layers 17 and 25 of the first and second electrodes 21 and 29 may include one selected from the group consisting of Al, Ti, Cr, Ni, Pt, Au, W, Cu, and Mo, or the multilayered structure thereof, but the embodiment is not limited thereto. For example, the second electrode layers 17 and 25 of the first and second electrodes 21 and 29 may include Cr/Ni/Ti/TiW/Ti or a lamination thereof. The Cr has an electrode function, the Ni has a junction function or a diffusion prevention function, the Ti has a junction function, and the TiW has a diffusion prevention function, but the embodiment is not limited thereto.

The third electrode layers 19 and 27 of the first and second electrodes 21 and 29 may facilitate the bonding with first and second bumps (not shown) while stably supporting the first and second bumps, but the embodiment is not limited thereto.

The third electrode layer 19 of the first electrode 21 may be formed on a portion of the lower surface of the second electrode layer 17. The third electrode layer 19 of the first electrode 21 may be formed on the lower surface of the second electrode layer 17 adjacent to the recess 33 as well as the recess 33.

The third electrode layer 27 of the second electrode 29 may be formed on a portion of the lower surface of the second electrode layer 25. A diameter of the third electrode layer 19 or 27 may be equal to or greater than that of the first electrode layer 15 or 23 and may be less than a width of the second electrode layer 17 or 25, but the embodiment is not limited thereto.

Although not shown, the third electrode layer 19 or 27 may be electrically connected to the package body of a light emitting device package by using the bump. If necessary, the third electrode layer 19 or 27 may not be formed. That is, the bump may make direct contact with the second electrode layer 17 or 25, but the embodiment is not limited thereto.

Similarly to the second electrode layers 17 and 25 of the first and second electrodes 21 and 29, the third electrode layers 19 and 27 of the first and second electrodes 21 and 29 may be formed of a material having superior electric conductivity. For example, the third electrode layers 19 and 27 of the first and second electrodes 21 and 29 may include one selected from the group consisting of Al, Ti, Cr, Ni, Pt, Au, W, Cu, and Mo, or the multilayered structure thereof, but the embodiment is not limited thereto.

The second and third electrode layers 17 and 19 of the first electrode 21 may be the same kind of a material or mutually different kinds of materials. The second and third electrode layers 17 and 19 of the second electrode 29 may be the same kind of a material or mutually different kinds of materials.

The insulating layer 31 may be formed in a lower area of the light emitting structure 11 except for the first and second electrodes 21 and 29. The insulating layer 31 may be formed on the lower surface of the reflective structure 13. The insulating layer 31 may be further formed on a portion of the lower surface of the second electrode layer 17 or 25 greater than a diameter of the third electrode layer 19 or 27. Although not shown, the insulating layer 31 may be formed on a portion of the lower surface of the third electrode layer 19 or 27, but the embodiment is not limited thereto.

The insulating layer 31 partially overlaps the second and/or third electrode layer 17 and/or 19 or 25 and/or 27, the second and/or third electrode layer 17 and/or 19 or 25 and/or 27 may be prevented from being delaminated from an upper layer, for example, the first and/or second electrode layers 15 and/or 17 or 23 and/or 25.

The first and second electrodes 21 and 29 may be exposed in a lower direction of the light emitting device 1 by the insulating layer 31. Although not shown, the exposed first and second electrodes 21 and 29 may be electrically connected to the package body of the light emitting device package by using the bump.

The insulating layer 31 may include a material of superior electric insulation. For example, the insulating layer 31 may include one selected from the group consisting of $SiO_2$, $SiO_x$, $SiO_xN_y$, $Si_3N_4$, and $Al_2O_3$, or the multilayered structure thereof, but the embodiment is not limited thereto.

Figure 5:
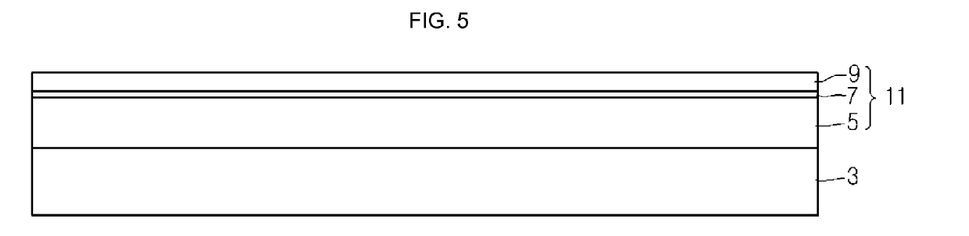
FIGS. 5 to 9 are views illustrating a process of forming a light emitting device according to the first embodiment.

FIGS. 5 to 9 are views illustrating a process of forming the light emitting device according to the first embodiment. Referring to FIG. 5, the growth substrate 3 is loaded to growth equipment. A plurality of layers or patterns may be formed on the growth substrate 3 by using a group II-VI compound semiconductor or a group III-V compound semiconductor.

The growth equipment may include an E-beam evaporator, PVD (physical vapor deposition), CVD (chemical vapor deposition), PLD (plasma laser deposition), a dual-type thermal evaporator, sputtering, or MOCVD (metal organic chemical vapor deposition), but the embodiment is not limited thereto.

The growth substrate 3 may include a conductive substrate or an insulating substrate. For example, the growth substrate 3 may include one selected from the group consisting of $Al_2O_3$, GaN, SiC, ZnO, Si, GaP, InP, $Ga_2O_3$, and GaAs.

Although not shown, a concavo-convex pattern having a lens shape or a stripe shape may be formed on the upper surface of the growth substrate 3, so that the light generated from the active layer 7 may be diffused or scattered by the concavo-convex pattern, thereby improving the light extraction efficiency, but the embodiment is not limited thereto.

For example, the light emitting structure 11 including at least the first and second conductive semiconductor layers 5 and 9, and the active layer 7 may be grown on the growth substrate 3 by using MOCVD equipment.

Although not shown, in order to relieve the lattice constant between the growth substrate 3 and the light emitting structure 11, a buffer layer may be grown on the growth substrate 3 and the light emitting structure 11 may be formed of a group II-VI or III-V compound semiconductor material. For example, the light emitting structure 11 may be formed of a material selected from the group consisting of GaN, AlN, AlGaN, InGaN, InN, InAlGaN, AlInN, AlGaAs, GaP, GaAs, GaAsP and AlGaInP.

Although not shown, a non-conductive semiconductor layer may be grown between the growth substrate 3 or the buffer layer and the light emitting structure 11, but the embodiment is not limited thereto. The non-conductive semiconductor layer may include a compound semiconductor layer including dopants, but the embodiment is not limited thereto. In addition, the non-conductive semiconductor layer may include a compound semiconductor layer having a conductivity less than that of the first conductive semiconductor layer 5, but the embodiment is not limited thereto.

The first conductive semiconductor layer 5 may be grown on the buffer layer or the non-conductive semiconductor layer, the active layer 7 may be grown on the first conductive semiconductor layer 5, and the second conductive semiconductor layer 9 may be grown on the active layer 7.

For example, the first conductive semiconductor layer 5 may be an N-type semiconductor layer including N-type dopants, and the second conductive semiconductor layer 9 may be a P-type semiconductor layer including P-type dopants.

Since the first and second conductive semiconductor layers 5 and 9 and the active layer 7 have been described above, the more detailed descriptions will be omitted.

Figure 6:
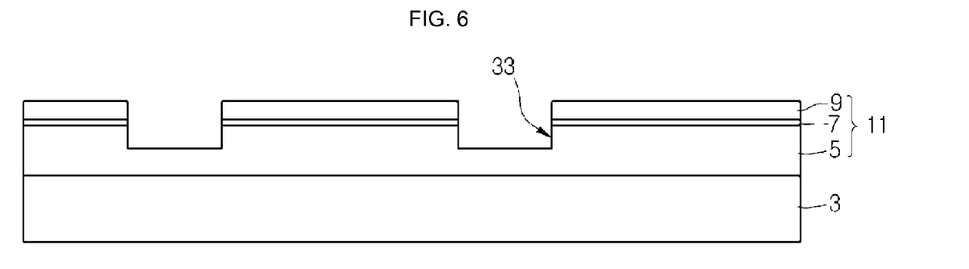

Referring to FIG. 6, at least one recess 33 may be formed in the light emitting structure 11 through an etching process. The recess 33 may extend from the upper surface of the light emitting structure 11, that is, the upper surface of the second conductive semiconductor layer 9 to an inside so that the recess 33 may pass through a portion of the light emitting structure 11. Through an etching process, the second conductive semiconductor layer and the active layer 7 may be removed and the portion of the first conductive semiconductor layer 5 may be removed from the upper surface thereof. The second conductive semiconductor layer 9 and the active layer 7 may be perforated by the recess 33 and a portion of the upper surface of the first conductive semiconductor layer 5 may be exposed.

The recesses 33 may be arranged in a shape shown in FIG. 1, but the embodiment is not limited thereto.

Figure 7:
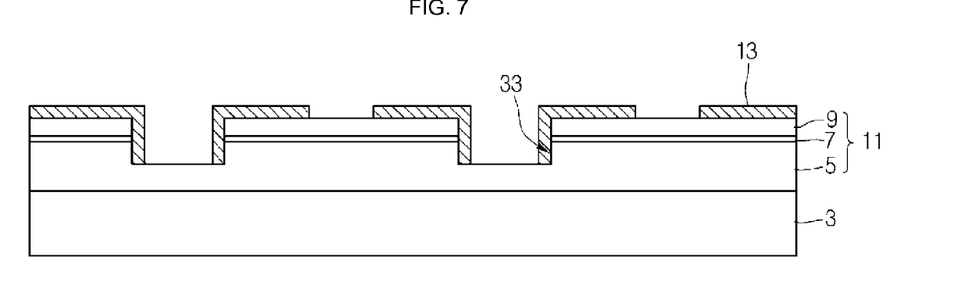

Referring to FIG. 7, the reflective structure 13 may be formed on the light emitting structure 11. The reflective structure 13 may be formed on the upper surface of the second conductive semiconductor layer 9. The reflective structure 13 may be formed on a side surface of the light emitting structure 11 in the recess 33. For example, the reflective structure 13 may be formed side surfaces of the second conductive semiconductor layer 9 and the active layer 7 in the recess 33. For example, the reflective structure 13 may be formed on a side surface of the first conductive semiconductor layer 5 in the recess 33.

As shown in FIG. 3, the reflective structure 13 may be formed by repeatedly stacking the pair of the first refractive index layer 35a, 35b or 35c and the second refractive index layer 37a, 37b or 37c at 3 to 30 times, but the embodiment is not limited thereto.

The reflective structure 13, which is previously prepared in a thin film having a tape shape, may be attached onto the light emitting structure 11. For example, the reflective structure 13 may be directly formed on the light emitting structure 11 by using sputtering or deposition equipment.

The light generated from the light emitting structure 11 may be reflected by the reflective structure 13 by about 98% or more, but the embodiment is not limited thereto.

In addition, since the reflective structure 13 has an insulating function, the first and second electrodes 21 and 29, which are formed through next processes, may be insulated from each other. Thus, since the reflective structure 13 is used, there is no need to form any additional insulating layers.

Figure 8:
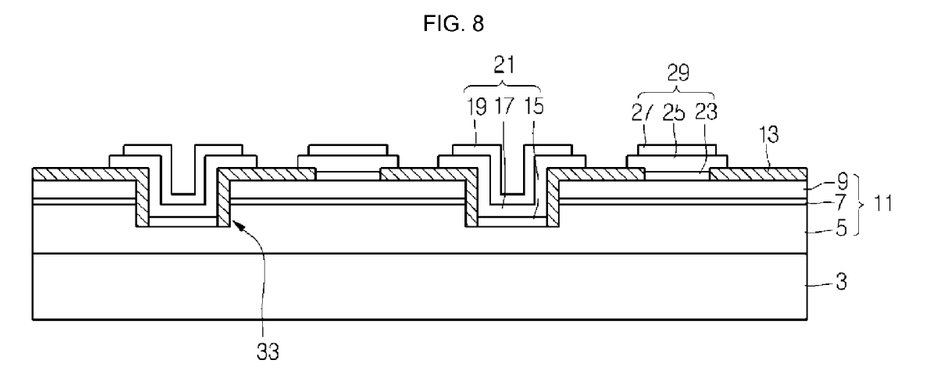

Referring to FIG. 8, the first electrode 21 may formed in the first contact area 20 and the second electrode 29 may be formed in the second contact area 22. As described above, the first contact area 20 may be defined by the first recess 33 and the second contact area 22 may be defined on the second conductive semiconductor layer 9.

The first, second and third electrode layers 15, 17 and 19 may be formed in sequence on the first contact area 20 so that the first electrode 21 may be formed.

The first, second and third electrode layers 15, 17 and 19 may be formed in sequence on the second contact area 22 so that the second electrode 29 may be formed The first electrode layer 15 of the first electrode 21 may be formed on the upper surface of the first conductive semiconductor layer 5 exposed through the recess 33 in the first contact area 20. The second electrode layer 17 of the first electrode 21 may have a diameter greater than that of the first electrode layer 15 and may electrically connect the first electrode layers 15 formed in the adjacent first contact areas 20 to each other. The third electrode layer 19 of the first electrode 21 may have a diameter greater than that of the first electrode layer 15 and less than a width of the second electrode layer 17. If necessary, the third electrode layer 19 may not be formed, but the embodiment is not limited thereto.

The first electrode layer 23 of the second electrode 29 may be formed on the upper surface of the second conductive semiconductor layer 9 in the first contact area 20. The second electrode layer 25 of the second electrode 29 may have a width greater than a diameter of the first electrode layer 23 and may electrically connect the first electrode layers 23 formed in the adjacent second contact areas 22 to each other. The third electrode layer 27 of the second electrode 29 may have a diameter greater than that of the first electrode layer 23 and less than a width of the second electrode layer 25. If necessary, the third electrode layer 27 may not be formed, but the embodiment is not limited thereto.

The first electrode layer 15 or 23 may have a function as a reflective layer, the second electrode layer 17 or 25 may have a function as an electrode and the third electrode may have a function as a contact pad, but the embodiment is not limited thereto.

Figure 9:
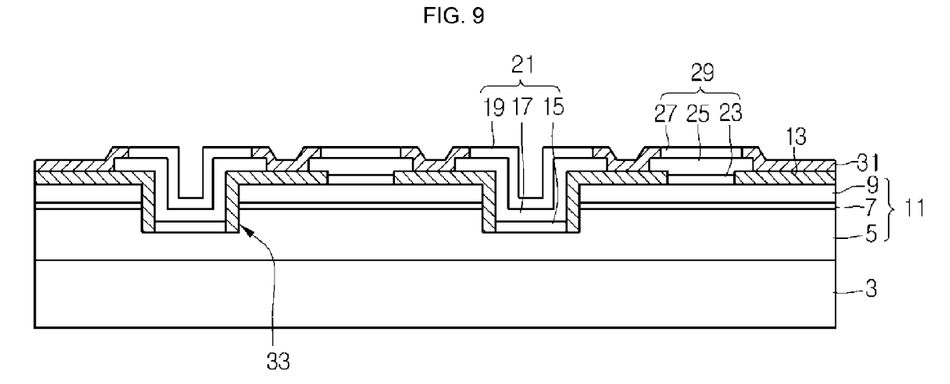

Referring to FIG. 9, the insulating layer 31 may be formed on the reflective structure 13 exposed between the first and second electrodes 21 and 29. The insulating layer 31 may insulate the first and second electrode 21 and 29 from each other. The insulating layer 31 may be formed such that portions of the upper surface of the second electrode layer 17 and 25 of the first and second electrodes 21 and 29 overlap with portions of the upper surfaces of the third electrode layers 19 and 27, so that, as well as the first electrode layers 15 and 23, the second and third electrode layers 17, 25, 19 and 27 may be prevented from being peeled off.

Figure 10:
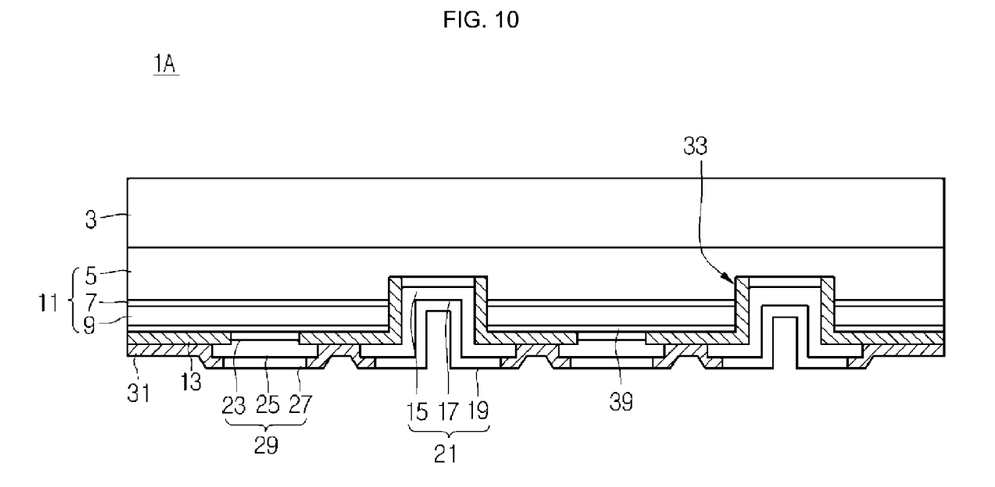
FIG. 10 is a sectional view showing a light emitting device according to the second embodiment.

FIG. 10 is a sectional view showing a light emitting device according to the second embodiment. The second embodiment is almost similar to the first embodiment except that a current spreading layer 39 is further formed between the light emitting structure 11 and the second electrode 29. In the following description of the second embodiment, the elements having the same function, material and/or shape as those of the first embodiment will be assigned with the same reference numerals and the detailed descriptions will be omitted.

Referring to FIGS. 1 and 10, a light emitting device 1A according to the second embodiment may include a growth substrate 3, a light emitting structure 11, a current spreading layer 39, a reflective structure 13, and first and second electrodes 21 and 29.

The current spreading layer 39 may be formed below the light emitting structure 11. In detail, the current spreading layer 39 may be formed on a lower surface of the second conductive semiconductor layer 9. The current spreading layer 39 may be formed between the second conductive semiconductor layer 9 of the light emitting structure 11 and the second electrode 29. An upper surface of the current spreading layer 39 may make contact with the lower surface of the second conductive semiconductor layer 9, and a lower surface of the current spreading layer 39 may make contact with an upper surface of the second electrode 29, that is, an upper surface of a first electrode layer 23 of the second electrode 29. The current spreading layer 39 may spread electric power or current supplied to the second electrode 29 such that the electric power or current is supplied to the entire region of the second conductive semiconductor layer 9. To this end, the current spreading layer 39 may be formed to make contact with the entire region of the second conductive semiconductor layer 9.

After the current supplied to the second electrode 29 is spread to the entire region of the current spreading layer 39, the current may be provided from the entire region of the current spreading layer 39 to the second conductive semiconductor layer 9. Thus, since light may be generated from the entire region of the active layer 7 corresponding to the entire region of the second conductive semiconductor layer 9, the light efficiency may be improved.

The current spreading layer 39 may be formed between the second conductive semiconductor layer 9 and the reflective structure 13. The current spreading layer 39 may allow the reflective structure 13 to be adhesive more strongly to the second conductive semiconductor layer 9. In other words, the current spreading layer 39 may prevent the adhesive strength between the reflective structure 13 and the second conductive semiconductor layer 9 from being lowered.

The current spreading layer 39 may have an ohmic property together with the second conductive semiconductor layer 9. Thus, the current supplied to the current spreading layer 39 may be more smoothly provided to the second conductive semiconductor layer 9, so that the light efficiency may be improved.

The current spreading layer 39 may be formed of a conductive material having superior current diffusion and ohmic properties. For example, the current spreading layer 39 may include at least one selected from the group consisting of ITO, IZO(In—ZnO), GZO(Ga—ZnO), AZO(Al—ZnO), AGZO (Al—Ga ZnO), IGZO(In—Ga ZnO), IrOx, RuOx, RuOx/ITO, Ni/IrOx/Au and Ni/IrOx/Au/ITO, or the multilayered structure thereof, but the embodiment is not limited thereto.

Figure 11:
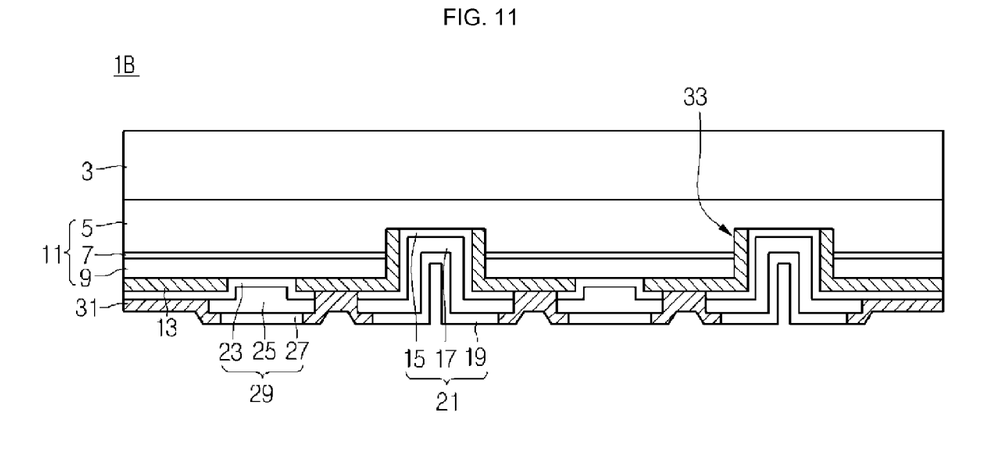
FIG. 11 is a sectional view showing a light emitting device according to the third embodiment.

FIG. 11 is a sectional view showing a light emitting device according to the third embodiment. The third embodiment is almost similar to the first embodiment except that first electrode layers 15 and 23 of the first and second electrodes 21 and 29 are formed on the reflective structure 13. In the following description of the third embodiment, the elements having the same function, material and/or shape as those of the first embodiment will be assigned with the same reference numerals and the detailed descriptions will be omitted.

Referring to FIGS. 1 and 11, a light emitting device 1B according to the third embodiment may include a growth substrate 3, a light emitting structure 11, a reflective structure 13, and first and second electrodes 21 and 29.

Each of the first and second electrodes 21 and 29 may include a first electrode layer 15 or 23, a second electrode layer 17 or 25 and a third electrode layer 19 or 27. The second electrode layer 17 or 25 may be formed below the first electrode layer 15 or 23 and the third electrode layer 19 or 27 may be formed below the second electrode layer 17 or 25.

The first electrode layer 15 of the first electrode 21 may be formed on the lower surface of the first conductive semiconductor layer 5 of the light emitting structure 11 in the recess 33 in the first contact area 20. The first electrode layer 15 of the first electrode 21 may be formed on the inside surface of the reflective structure 13 in the recess 33. The first electrode layer 15 of the first electrode 21 may be formed on a portion of the lower surface of the reflective structure 13 around the recess 33. In other words, the first electrode layer 15 of the first electrode 21 may extend from the lower surface of the first conductive semiconductor layer 5 in the recess 33 to a portion of the lower surface of the reflective structure 13 around the recess 33 via the inside surface of the reflective structure 13 in the recess 33, but the embodiment is not limited thereto.

The first electrode layer 23 of the second electrode 29 may be formed on the lower surface of the second conductive semiconductor layer 9 of the light emitting structure 11 in the second contact area 22. The first electrode layer 23 of the second electrode 29 may be formed on a portion of the lower surface of the reflective structure 13. In other words, the first electrode layer 23 of the second electrode 29 may extend from the lower surface of the second conductive semiconductor layer 9 of the light emitting structure 11 in the first contact area 20 to a portion of the lower surface of the reflective structure 13, but the embodiment is not limited thereto.

The first electrode layer 15 of the first electrode 21 may be spaced apart from the first electrode layer 23 of the second electrode 29 in the reflective structure 13.

The insulating layer 31 may be formed on the lower surface of the reflective structure 13 between the first electrode layers 15 and 23 of the first and second electrodes 21 and 29, but the embodiment is not limited thereto. The insulating layer 31 may be formed on portions of the lower surfaces of the second electrode layers 17 and 25 of the first and second electrodes 21 and 29, but the embodiment is not limited thereto. Although not shown, the insulating layer 31 may be formed on portions of the lower surfaces of the third electrode layers 19 and 27 of the first and second electrodes 21 and 29, but the embodiment is not limited thereto.

As described above, the reflectivity of the reflective structure 13 may be 98%. Thus, a part of the light of the light emitting structure 11 may be transmitted through the reflective structure 13 so that light loss may occur.

In the third embodiment, since the first electrode layers 15 and 23 of the first and second electrode 21 and 29 are formed on the lower surface of the reflective structure 13, the light, which may penetrate through the reflective structure 13 by the first and second electrode layers 15 and 25 of the first and second electrodes 21 and 29, may be reflected, so that the light reflectivity may be more increased, thereby improving the light efficiency.

Figure 12:
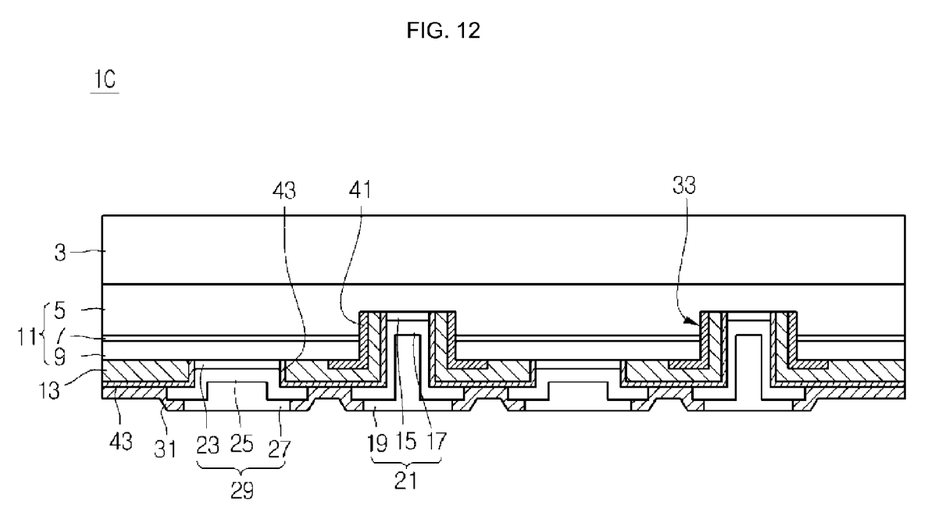
FIG. 12 is a sectional view showing a light emitting device according to the fourth embodiment

FIG. 12 is a sectional view showing a light emitting device according to the fourth embodiment.

The fourth embodiment is similar to the first embodiment except that insulating layers 41 and 43 is further included on the upper surface and/or lower surface of the reflective structure 13. In the following description of the fourth embodiment, the elements having the same function, material and/or shape as those of the first embodiment will be assigned with the same reference numerals and the detailed descriptions will be omitted.

Referring to FIGS. 1 and 12, a light emitting device 1C according to the fourth embodiment may include a growth substrate 3, a light emitting structure 11, first to third insulating layers 41, 43 and 31, a reflective structure 13, and first and second electrodes 21 and 29.

The first insulating layer 41 may be formed on an inside surface of the light emitting structure 11 in the recess 33 in the first contact area 20. In detail, the first insulating layer 41 may be formed on an inside surface of the first conductive semiconductor layer 5 of the light emitting structure 11 in the recess 33, an inside surface of the active layer 7 and an inside surface of the second conductive semiconductor layer 9. The first insulating layer 41 may be formed on a portion of the lower surface of the second conductive semiconductor layer 9 of the light emitting structure 11 around the recess 33.

The reflective structure 13 may be formed on a side surface of the first insulating layer 41 in the recess 33 in the first contact area 20. The reflective structure 13 may be formed on a lower surface of the insulating layer 41 around the recess 33. The reflective structure 13 may extend from the lower surface of the first insulating layer 41 so that the reflective structure 13 may be adjacent to the second electrode 29 and may be formed on the lower surface of the second conductive semiconductor layer 9. In other words, the reflective structure 13 may be formed to cover the first insulating layer 41.

The reflective structure 13 may surround the second electrode 29 and may be formed on the lower surface of the second conductive semiconductor layer 9. That is, the reflective structure 13 may be formed on the entire lower surface of the second conductive semiconductor layer 9 except for the second electrode 29, but the embodiment is not limited thereto.

The second insulating layer 43 may be formed to cover the reflective structure 13, but the embodiment is not limited thereto. The second insulating layer 43 may be formed on a side surface of the reflective structure 13 in the recess 33 and may extend the side surface of the reflective structure 13 such that the second insulating layer 43 may be formed on the lower surface of the reflective structure 13 around the recess 33.

The second insulating layer 43 may be formed to surround the first electrode 21. The second insulating layer 43 may be formed to surround the second electrode 29. The second insulating layer 43 may be formed between the first electrode 21 and the reflective structure 13. The second insulating layer 43 may be formed between the second electrode 29 and the reflective structure 13.

The third insulating layer 31 may be formed between the first and second electrodes 21 and 29. The third insulating layer 31 may be formed on the lower surface of the second insulating layer 43 between the first and second electrodes 21 and 29. The first and second electrodes 21 and 29 may be electrically insulated from each other by the third insulating layer 31.

The first to third insulating layers 41, 43 and 31 may be formed of a material having a superior insulation property. For example, the first to third insulating layers 41, 43 and 31 may include one selected from the group consisting of $SiO_2$, $SiO_x$, $SiO_xN_y$, $Si_3N_4$, and $Al_2O_3$, or the multilayered structure thereof, but the embodiment is not limited thereto.

In the fourth embodiment, the first and second insulating layers 41 and 43 may be formed under a precondition that the reflective structure 13 has conductivity.

As described above, the reflective structure 13 may be formed by alternating the first refractive index layer 35a, 35b or 35c and the second refractive index layer 37a, 37b or 37c, each of which includes at least one selected from the group consisting of TiN, AlN, $TiO_2$, $Al_2O_3$, $SnO_2$, $WO_3$, $ZrO_2$ and $SiO_2$.

Some of the materials may have conductivity. Thus, when a material having conductivity is used as the reflective structure 13, the reflective structure 13 may be electrically connected to the first and second electrodes 21 and 29, so that the first electrode 21 may be short circuited to the second electrode 29. In addition, the reflective structure 13 may be short circuited to the light emitting structure 11, so that an error may occur in the light emitting device.

Therefore, since the first insulating layer 41 is formed between the light emitting structure 11 and the reflective structure 13, the light emitting structure 11 may be prevented from being short circuited to the reflective structure 13. In addition, the second insulating layer 43 may be formed between the reflective structure 13 and the first electrode 21 and/or the second electrode 29, so that the light emitting structure 11 may be prevented from being short circuited to the reflective structure 13.

Figure 13:
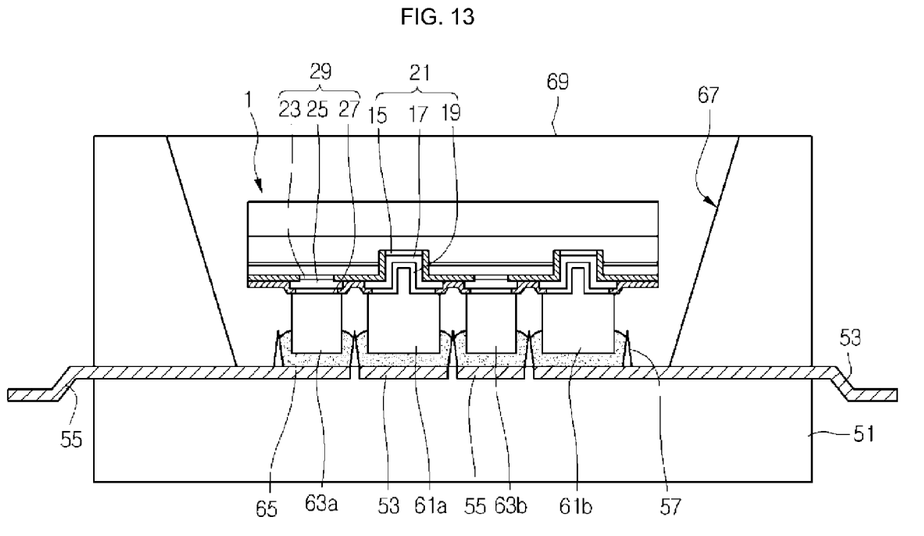
FIG. 13 is a sectional view showing a light emitting device package according to an embodiment.

FIG. 13 is a sectional view showing a light emitting device package according to an embodiment. Referring to FIG. 13, the light emitting device package may include a light emitting device 1 to generate light and a package body 51 on which the light emitting device 1 is mounted.

Although the light emitting device 1 according to the first embodiment is depicted in FIG. 13, the light emitting devices according to the second to fourth embodiments may be applied to the light emitting device package of FIG. 13. The light emitting device 1 may include a flip-chip type light emitting device, but the embodiment is not limited thereto.

The package body 51 may be formed with a cavity 67 having an inclined surface in an upper region thereof and recessed downwardly. In other words, the cavity 67 may include a bottom surface and an inside surface inclined to the bottom surface and the inside surface of the cavity 67 may be perpendicular to the bottom surface, but the embodiment is not limited thereto.

First and second electrode lines 53 and 55 may be formed through the package body 51. The first and second electrode lines 53 and 55 may horizontally or vertically pass through the package body 51, but the embodiment is not limited thereto. The first and second electrode lines 53 and 55 may be insulated and spaced apart from each other. The first and second electrode lines 53 and 55 may be formed on the bottom surface of the cavity 67. The first and second electrode lines 53 and 55 may pass through the package body 51 from the bottom surface of the cavity 67 and may be formed on an outside surface of the package body 51, but the embodiment is not limited thereto.

The first and second electrode lines 53 and 55 may include a metallic material, for example, an alloy including at least one or two selected from the group consisting of Cu, Al, Cr, Pt, Ni, Ti, Au, and W, representing superior electric conductivity and superior corrosion resistance, but the embodiment is not limited thereto.

The package body 51 may be formed through an injection molding process in state that the first and second electrodes lines 53 and 55 are placed, so that the first and second electrode lines 53 and 55 may fix the package body 51, but the embodiment is not limited thereto.

The first and second electrode lines 53 and 55 may include a single layer or a multi-layer, but the embodiment is not limited thereto. The uppermost layers of the first and second electrode lines 53 and 55 may include reflective layers such as Ag or Al, but the embodiment is not limited thereto.

The light emitting device 1 may be physically fixed to and electrically connected to the first and second electrode lines 53 and 55 by using the first bump 61a or 61b, the second bump 63a or 63b and a solder paste 65. The first electrode 21 and the first electrode line 53 of the light emitting device 1 may be electrically connected to each other through the first bump 61a or 61b. The second electrode 29 and the second electrode line 55 of the light emitting device 1 may be electrically connected to each other through the second bump 63a or 63b.

Although the first and second bumps 61a or 61b and 63a or 63b having mutually different widths are shown in the drawings, the width of the first bump 61a or 61b may be equal to that of the second bump 63a or 63b.

The first and second bumps 61a or 61b and 63a or 63b may be firmly fixed to the first and second electrode lines 53 and 55 by using the solder paste 65, respectively.

The solder pastes 65 formed around the first and second bumps 61a or 61b and 63a or 63b are too closed to each other so that the solder pastes 65 may be short circuited to each other. Thus, to prevent such a short circuit, a bank 57 may be formed on the bottom surface in the cavity 67 between the first and second bumps 61a or 61b and 63a or 63b. For example, when viewed from the top view, the bank 57 may have a circular shape of a closed loop. A height of the bank 57 may be formed to be higher than a top surface of the solder paste 65, but the embodiment is not limited thereto.

As shown in the drawings, an upper portion of the bank 57 may have a vertex. Although not shown, the upper portion of the bank 57 may have a circular shape or a flat shape. The bank 57 may be formed integrally with the package body 51 through a molding injection process. The bank 57 may be formed of the same material as that of the package body 51, but the embodiment is not limited thereto.

The bank 57 may be formed regardless of the package body 51. After the bank 57 is previously processed, the bank 57 may be attached on the bottom surface of the cavity 67 of the package body 51, but the embodiment is not limited thereto.

The first and second electrode lines 53 and 55 may be formed between the bank 57 and the package body 51, but the embodiment is not limited thereto.

A molding member 69 may be formed to surround the light emitting device 1. The molding member 69 may be formed in the cavity 67. In other words, the molding member 69 may be filled into the cavity 67.

The molding member 69 may include a phosphor to convert a wavelength of light. A top surface of the molding member 69 may be formed at a level equal to, higher than or lower than the top surface of the package body 51. The molding member 69 may be formed of a material representing superior property in transmission, heat radiation, and/or insulation. For example, the molding member 69 may be formed of a silicon material or an epoxy material, but the embodiment is not limited thereto.

Although not shown, the light emitting devices according to the first to third embodiments may be applied to a COB (chip on board) type light emitting device package. A plurality of light emitting devices may be mounted on a sub-mount in the COB light emitting device package, but the embodiment is not limited thereto.

The light emitting devices and the light emitting device packages according to the embodiments are applicable to a light unit. The light unit is applicable to a display device and a lighting device, such as a lighting lamp, a signal lamp, a headlight of a vehicle, an electric signboard, and an indication lamp.

The embodiment provides a light emitting device having improved light efficiency.

The embodiment provides a light emitting device capable of improving reliability thereof.

The embodiment provides a light emitting device package having a light emitting device.

According to the embodiment, there is provided a light emitting device including a substrate; a light emitting structure below substrate, in which at least one first contact area and at least one second contact area adjacent to the first contact area are defined; and a reflective structure below the light emitting structure, the reflective structure including a plurality of layers having mutually different refractive indexes.

According to the embodiment, there is provided a light emitting device including: a substrate; a light emitting structure including a first conductive semiconductor layer disposed below the substrate, an active layer disposed below the first conductive semiconductor layer and a second conductive semiconductor layer disposed below the active layer, in which at least one first contact area is defined on a lower surface of the first conductive semiconductor layer, at least one second contact area is defined on a lower surface of the second conductive semiconductor layer, and a recess is formed in the first contact area to expose the first conductive semiconductor layer; a reflective structure including a plurality of layers having mutually different refractive indexes; a first electrode formed in the first contact area; and a second electrode formed in the second contact area, wherein the reflective structure extends from a lower surface of the second conductive semiconductor layer between the first and second electrodes to an inside surface of the light emitting structure in the recess.

According to the embodiment, there is provided a light emitting device package including: a body having a cavity; first and second electrode lines disposed in the cavity; a light emitting device disposed on the first and second electrode lines and claimed in one of claims; and a molding member surrounding the light emitting device.

According to the embodiment, since the reflective structure capable of reflecting light is formed below the light emitting structure, the light efficiency may be improved.

According to the embodiment, since the reflective structure is allowed to have an insulating function as well as a light reflecting function, there is no need to additionally form an insulating layer, so that the structure may be simple and the cost may be reduced.

According to the embodiment, since the insulating layer overlaps a portion of the electrode, the electrode is prevented from being delaminated so that the reliability may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a light emitting structure below the substrate, in which at least one first contact area and at least one second contact area adjacent to the first contact area are defined in the light emitting structure;
   a reflective structure below the light emitting structure, the reflective structure including a plurality of layers having mutually different refractive indexes;
   a first electrode disposed in the first contact area; and
   a second electrode disposed in the second contact area, wherein the reflective structure is disposed between the first electrode and the second electrode, and wherein the reflective structure has reflection and insulating properties.

2. The light emitting device of claim 1, wherein the light emitting structure includes at least a first conductive semiconductor layer, an active layer and a second conductive semiconductor layer, and wherein the first conductive semiconductor layer is provided below the substrate, the active layer is disposed below the first conductive semiconductor layer, and the second conductive semiconductor layer is provided below the active layer.

3. The light emitting device of claim 2, wherein a recess is formed in the first contact area to expose the first conductive semiconductor layer.

4. The light emitting device of one of claim 3, further comprising:
   a first electrode disposed in the first contact area; and
   a second electrode disposed in the second contact area, wherein each of the first electrode and the second electrode includes at least one electrode layer, and wherein a first electrode layer of the at least one electrode layer includes a reflective material.

5. The light emitting device of claim 3, wherein the reflective structure is formed on a lower surface of the second conductive semiconductor layer.

6. The light emitting device of claim 5, wherein the reflective structure is formed on an inside surface of the light emitting structure in the recess.

7. The light emitting device of claim 3, wherein the recess has a cylindrical shape, and an upper surface of the cylindrical shape is included in the first contact area through which the first conductive semiconductor layer is exposed.

8. The light emitting device of claim 4, wherein the reflective structure is formed on a lower surface of the second conductive semiconductor layer between the first and second electrodes.

9. The light emitting device of claim 4, wherein the reflective structure is formed below the light emitting structure except for the first and second electrodes.

10. The light emitting device of claim 4, wherein the first electrode includes a first electrode layer disposed on a lower surface of the first conductive semiconductor layer and a second electrode layer disposed on a lower surface of the first electrode layer.

11. The light emitting device of claim 10, wherein the second electrode layer of the first electrode electrically connects the first contact areas to each other in the recesses adjacent to each other.

12. The light emitting device of claim 10, further comprising an insulating layer partially overlapped with a lower surface of the reflective structure 13 and low surfaces of the first and second electrodes.

13. The light emitting device of claim 4, wherein the second electrode includes a first electrode layer disposed on a lower surface of the second conductive semiconductor layer; and
   a second layer disposed on a lower surface of the first electrode layer.

14. The light emitting device of claim 13, wherein the second electrode layer of the second electrode electrically connects adjacent second contact areas to each other.

15. The light emitting device of claim 4, further comprising a current spreading layer between the second conductive semiconductor layer and the reflective structure and between the second conductive semiconductor layer and the second electrode.

16. The light emitting device of one of claim 1, wherein the reflective structure includes first and second refractive index layers having mutually different refractive indexes, and 3 to 30 pairs of the first and second refractive index layers are provided.

17. The light emitting device of claim 16, wherein the reflective structure has reflection and insulating properties.

18. The light emitting device of claim 16, wherein each of the first and second refractive indexes includes at least one selected from the group consisting of TiN, AlN, $TiO_2$, $Al_2O_3$, $SnO_2$, $WO_3$, $ZrO_2$ and $SiO_2$.

19. A light emitting device package having a light emitting device of claim 1, comprising:
- a body having a cavity;
- first and second electrode lines disposed in the cavity;
- a light emitting device disposed on the first and second electrode lines; and
- a molding member surrounding the light emitting device.

20. A light emitting device, comprising:
- a substrate;
- a light emitting structure including a first conductive semiconductor layer disposed below the substrate, an active layer disposed below the first conductive semiconductor layer and a second conductive semiconductor layer disposed below the active layer, in which at least one first contact area is defined on a lower surface of the first conductive semiconductor layer, at least one second contact area is defined on a lower surface of the second conductive semiconductor layer, and a recess is formed in the first contact area to expose the first conductive semiconductor layer;
- a reflective structure including a plurality of layers having mutually different refractive indexes;
- a first electrode formed in the first contact area; and
- a second electrode formed in the second contact area, wherein the reflective structure extends from a lower surface of the second conductive semiconductor layer between the first and second electrodes to an inside surface of the light emitting structure in the recess, and wherein the reflective structure has reflection and insulating properties.

* * * * *